United States Patent
Wu et al.

(10) Patent No.: US 8,073,179 B2
(45) Date of Patent: Dec. 6, 2011

(54) MEMS MICROPHONE PACKAGE WITH RF INSENSITIVE MEMS MICROPHONE CHIP

(75) Inventors: Li-Te Wu, Taipei (TW); Chia-Jen Hsu, Taipei (TW)

(73) Assignee: Fortemedia, Inc., Cupertino, CA (US)

( * ) Notice: Subject to any disclaimer, the term of this patent is extended or adjusted under 35 U.S.C. 154(b) by 846 days.

(21) Appl. No.: 12/137,610

(22) Filed: Jun. 12, 2008

(65) Prior Publication Data

US 2009/0310810 A1 Dec. 17, 2009

(51) Int. Cl.
*H04R 9/08* (2006.01)
*H04R 9/06* (2006.01)

(52) U.S. Cl. .......... 381/355; 381/91; 381/162; 381/178; 381/189; 381/316; 381/369; 381/372; 381/402

(58) Field of Classification Search .............. 381/91, 381/355, 369, 162, 178, 189, 316, 372, 402; 438/50, 52, 53
See application file for complete search history.

(56) References Cited

U.S. PATENT DOCUMENTS

| 2006/0177083 A1* | 8/2006 | Sjursen et al. ................ 381/322 |
| 2007/0057602 A1* | 3/2007 | Song ............................ 310/328 |

* cited by examiner

*Primary Examiner* — Long Tran
(74) *Attorney, Agent, or Firm* — Thomas|Kayden

(57) ABSTRACT

A micro-electro-mechanical-system microphone package includes a substrate, a micro-electro-mechanical-system microphone chip mounted on the substrate, and a cover attached to the substrate to cover the micro-electro-mechanical-system microphone chip. The cover is provided with a sound inlet through which the micro-electro-mechanical-system microphone receives external sound. The micro-electro-mechanical-system microphone chip includes a conductive base connected to a constant voltage, a shielding layer supported by the conductive base and connected to the constant voltage, a diaphragm disposed between the conductive base and the shielding layer, and a back plate also disposed between the conductive base and the shielding layer.

16 Claims, 3 Drawing Sheets

US 8,073,179 B2

MEMS MICROPHONE PACKAGE WITH RF INSENSITIVE MEMS MICROPHONE CHIP

BACKGROUND OF THE INVENTION

1. Field of the Invention

The invention relates to an MEMS (micro-electro-mechanical-system) microphone package, and more particularly to an MEMS microphone package with an RF insensitive MEMS microphone chip.

2. Description of the Related Art

Referring to FIG. 1, a conventional MEMS (micro-electro-mechanical-system) microphone package includes a substrate 102, a metal cap 101 attached to the substrate 102, an MEMS microphone die 103 mounted on the substrate 102, and a readout IC (integrated circuit) chip 104 also mounted on the substrate 102.

The metal cap 101 has a sound inlet 106 through which the MEMS microphone die 103 receives external sound. The MEMS microphone die 103 includes a diaphragm and a back plate. The diaphragm vibrates according to the variation of sound pressure. The diaphragm and the back plate form a capacitor and the capacitance thereof is inverse proportional to the space between the diaphragm and the back plate.

A bonding wire 105 is connected between the MEMS microphone die 103 and the readout IC chip 104. The readout IC chip 104 provides bias voltage (around 12V) to bias the diaphragm and is capable of driving external low-impedance loading.

The metal cap 101 and the substrate 102 constitute a means for shielding, to protect the MEMS microphone die 103 from RF (radio frequency) interference.

BRIEF SUMMARY OF THE INVENTION

The invention provides an MEMS (micro-electro-mechanical-system) microphone package with an RF insensitive MEMS microphone chip. The MEMS microphone chip is capable of avoiding RF interference, without requirement for a metal cap for protection.

The MEMS microphone chip in accordance with an exemplary embodiment of the invention includes a conductive base, a shielding layer, a diaphragm, and a back plate. The conductive base is connected to a constant voltage. The shielding layer is supported by the conductive base and connected to the constant voltage. The diaphragm is disposed between the conductive base and the shielding layer. The back plate is also disposed between the conductive base and the shielding layer.

In another exemplary embodiment, the conductive base is perforated.

In yet another exemplary embodiment, the shielding layer is perforated.

The MEMS microphone package in accordance with an exemplary embodiment of the invention includes a substrate, an MEMS microphone chip as described above, and a cover. The MEMS microphone chip is mounted on the substrate. The cover is attached to the substrate to cover the MEMS microphone chip. The cover is provided with a sound inlet through which the MEMS microphone receives external sound.

In another exemplary embodiment, the cover is attached to the substrate by glue.

In yet another exemplary embodiment, the substrate is not electrically conductive.

In another exemplary embodiment, the substrate is made of copper clad laminate, ceramic, or plastic.

In yet another exemplary embodiment, the cover is not electrically conductive.

In another exemplary embodiment, the cover is made of copper clad laminate, ceramic, or plastic.

In yet another exemplary embodiment, the MEMS microphone chip includes a variable capacitor, a radio frequency attenuation circuit, and a shielding cage. The variable capacitor generates a signal corresponding to a sound pressure variation. The radio frequency attenuation circuit filters the signal. The shielding cage encloses the variable capacitor.

In another exemplary embodiment, the radio frequency attenuation circuit is a low pass filter.

In yet another exemplary embodiment, the radio frequency attenuation circuit is a notch filter.

In another exemplary embodiment, the MEMS microphone package includes a substrate, an MEMS microphone chip as described above, and a cover. The MEMS microphone chip is mounted on the substrate. The cover is attached to the substrate to cover the MEMS microphone chip. The cover is provided with a sound inlet through which the MEMS microphone receives external sound.

In yet another exemplary embodiment, the cover is attached to the substrate by glue.

In another exemplary embodiment, the substrate is not electrically conductive.

In yet another exemplary embodiment, the substrate is made of copper clad laminate, ceramic, or plastic.

In another exemplary embodiment, the cover is not electrically conductive.

In yet another exemplary embodiment, the cover is made of copper clad laminate, ceramic, or plastic.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
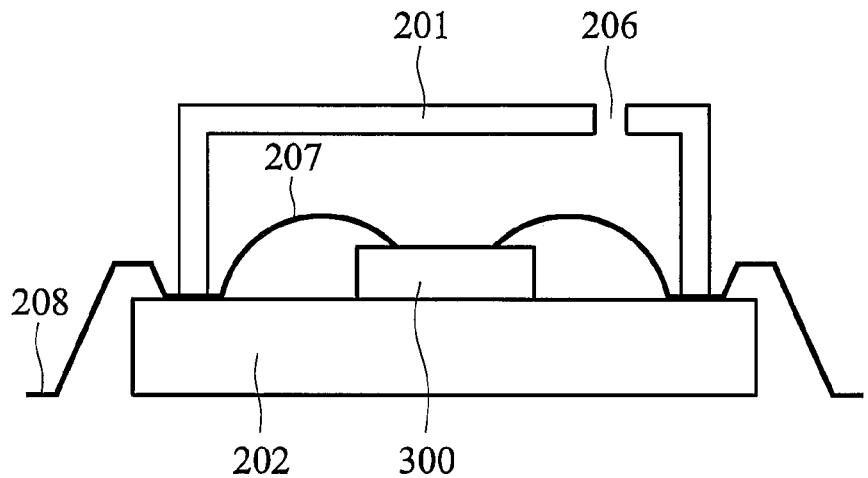
FIG. 2 is a schematic diagram of an MEMS microphone package in accordance with an embodiment of the invention.

Referring to FIG. 2, an MEMS (micro-electro-mechanical-system) microphone package in accordance with an embodiment of the invention is provided, including a substrate 202, a cover 201 attached to the substrate 202, and an RF (radio frequency) insensitive MEMS microphone chip 300 mounted on the substrate 202.

The cover 201 has a sound inlet 206 through which the MEMS microphone chip 300 receives external sound. A bonding wire 207 is connected between the MEMS microphone chip 300 and leads 208.

The cover 201 and the substrate 202 form an acoustic chamber, protecting the MEMS microphone chip 300 from external light, particles, moisture, and mechanical damage. To prevent acoustic leakage of the acoustic chamber, the cover 201 is glued to the substrate 202 for eliminating any gaps therebetween. In this embodiment, the material of the cover 201 and the substrate 202 is not electrically conductive, for example, FR4 (Flame Retardant 4 which is a kind of copper clad laminate), ceramic, plastic, etc.

Figure 3:
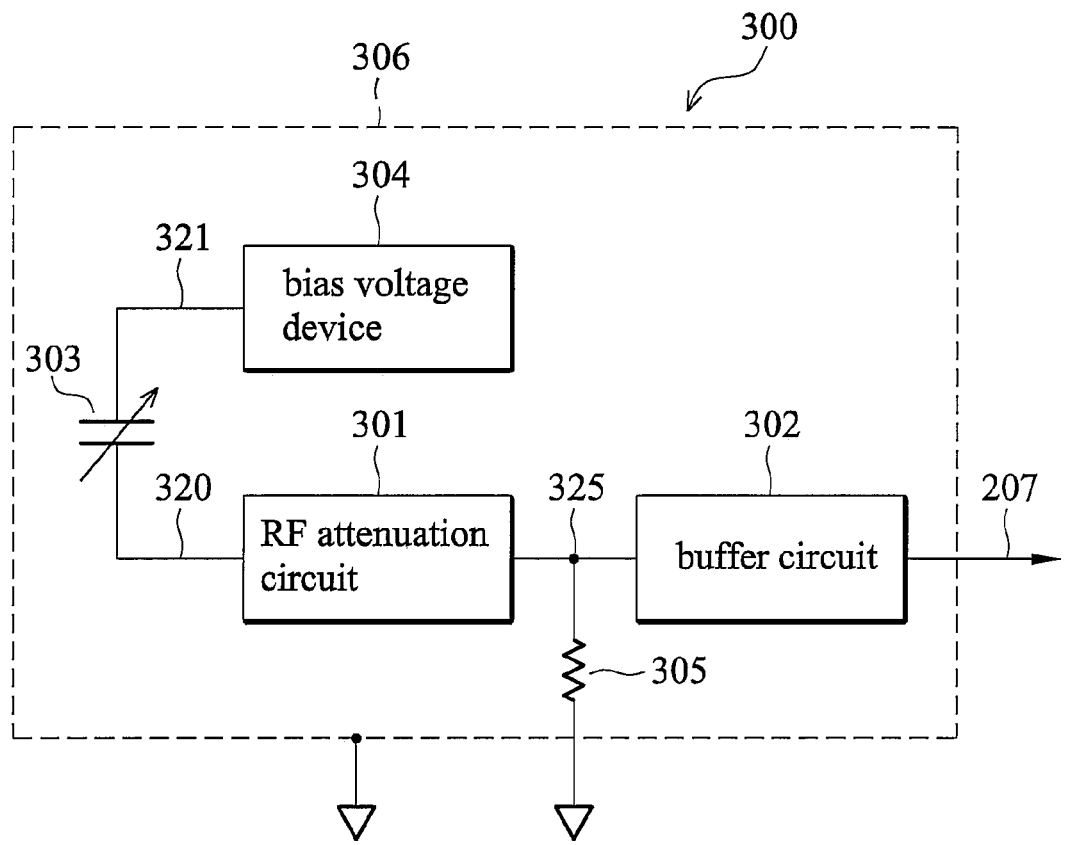
FIG. 3 is a block diagram of an MEMS microphone chip of the MEMS microphone package of FIG. 2.

Referring to FIG. 3, the RF insensitive MEMS microphone chip 300 includes a bias voltage device 304, an RF attenuation circuit 301, a buffer circuit 302, a variable capacitor 303, a shielding cage 306, and a high-impedance resistor 305, which are described in detail in the following:

The bias voltage device 304 may be a battery, a charge pump, or a regulator, providing a DC (direct current) bias voltage for a terminal 321 of the variable capacitor 303. Meanwhile, the other terminal 320 of the variable capacitor 303 is connected to the RF attenuation circuit 301.

Figure 4A:
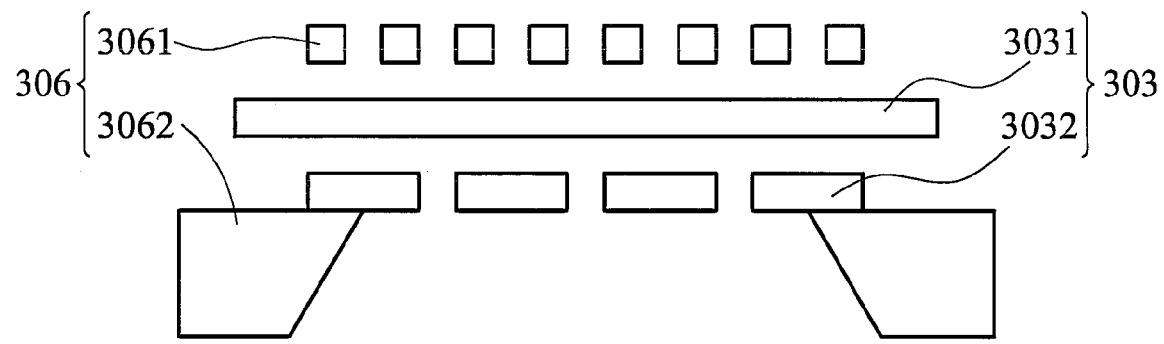
FIG. 4A is a schematic view showing the variable capacitor and the shielding cage of the MEMS microphone chip of FIG. 3.
Figure 4B:
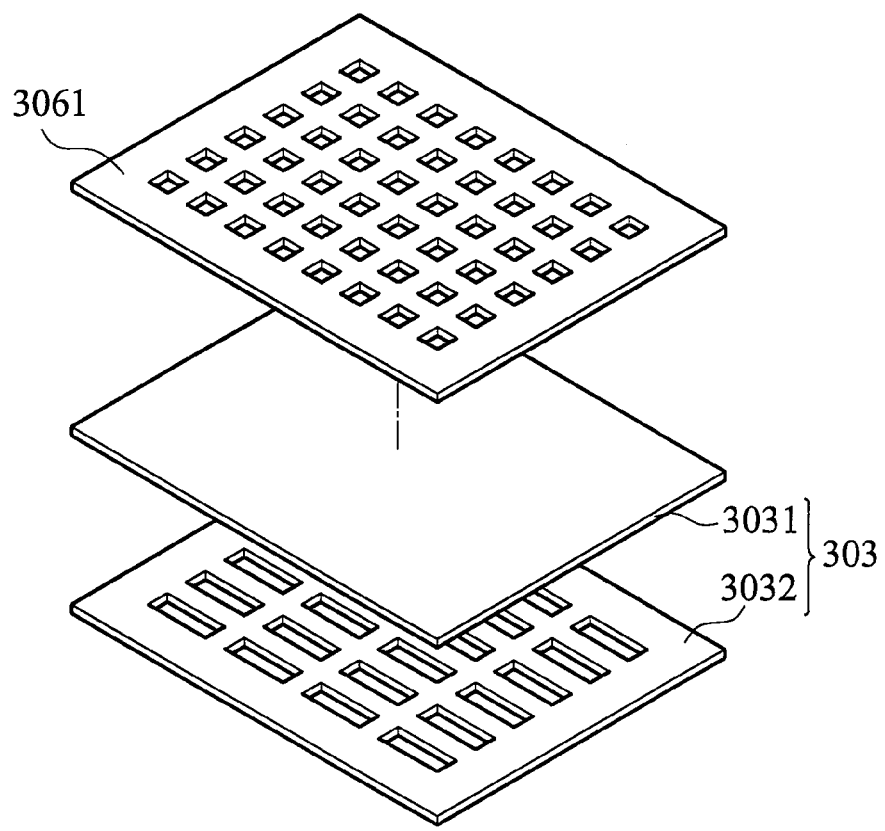
FIG. 4B is a perspective diagram showing the variable capacitor and the RF shielding layer of the MEMS microphone chip of FIG. 4A.

Referring to FIGS. 4A and 4B, the variable capacitor 303 includes a flexible diaphragm 3031 and a rigid back plate 3032, wherein the diaphragm 3031 can be connected to the bias voltage device 304 or the RF attenuation circuit 301. The diaphragm 3031 vibrates according to the sound pressure variation and correspondingly generates a signal. The RF attenuation circuit 301, serving as a low pass filter or a notch filter, filters out the signal in the frequency band of 800 MHz-5 GHz.

The resistor 305, having a resistance in the order of 0.1 G (ohms)-100 G (ohms), connects the node 325 to a constant reference voltage (e.g. AC ground).

The impedance of the buffer circuit 302 is ten times higher than that of the resistor 305. Furthermore, the output voltage of the buffer circuit 302 is proportional to the input voltage thereof.

The variable capacitor 303 is susceptible to RF interference and requires additional protection. In this embodiment, the variable capacitor 303, the bias voltage device 304, the RF attenuation circuit 301, and the buffer circuit 302 are enclosed by the shielding cage 306.

As shown in FIGS. 4A and 4B, the shielding cage 306 includes an RF shielding layer 3061 and a conductive base 3062, both of which are grounded or connected to a constant reference voltage. Furthermore, the diaphragm 3031 and back plate 3032 of the variable capacitor 303, and the RF shielding layer 3061 are supported by the base 3062. The RF shielding layer 3061 is made of metal, poly silicon, or other conductive materials, and formed by a semiconductor process. Both the RF shielding layer 3061 and the back plate 3032 are perforated. The holes of the RF shielding layer 3061 allow sound to penetrate and vibrate the diaphragm 3031. The holes of the back plate 3032 allow air to pass therethrough, thus facilitating vibration of the diaphragm 3031.

Figure 1:
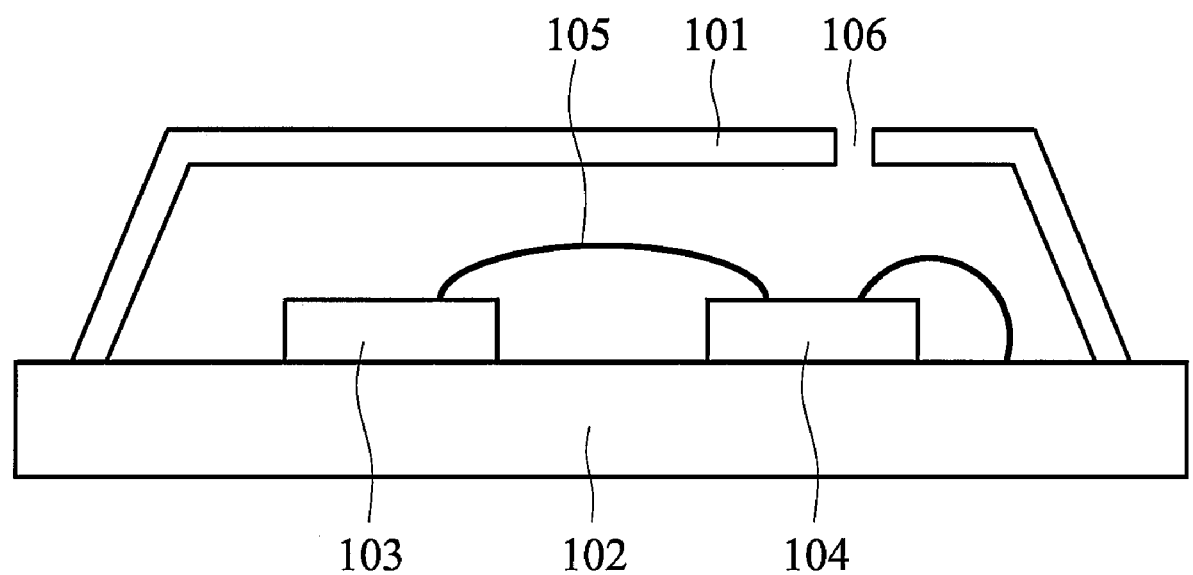
FIG. 1 is a schematic diagram of a conventional MEMS (micro-electro-mechanical-system) microphone package.

As described, the MEMS microphone chip 300 has a shielding cage 306 and an RF attenuation circuit 301 for avoiding RF interference. Thus, the cover 201 and the substrate 202, which enclose the MEMS microphone chip 300, can be made of non-conductive material. In other words, the MEMS microphone chip 300 is capable of avoiding RF interference, without requirement for a metal cap 106 for protection as shown in FIG. 1. The cover 201 and the substrate 202 in this embodiment are provided for protecting the MEMS microphone chip 300 from external light, particles, moisture, and mechanical damage.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A micro-electro-mechanical-system microphone chip, comprising: a conductive base connected to a constant voltage;
   a shielding layer supported by the conductive base and connected to the constant voltage;
   a variable capacitor generating a signal corresponding to a sound pressure variation comprising:
   a flexible diaphragm disposed between the conductive base and the shielding layer; and a rigid back plate also disposed between the conductive base and the shielding layer, Wherein the shielding layer and the rigid back plate are perforated.

2. The micro-electro-mechanical-system microphone chip as claimed in claim 1, further comprising:
   a radio frequency attenuation circuit filtering the signal; and
   a shielding cage enclosing the variable capacitor.

3. The micro-electro-mechanical-system microphone chip as claimed in claim 2, wherein the radio frequency attenuation circuit is a low pass filter.

4. The micro-electro-mechanical-system microphone chip as claimed in claim 2, wherein the radio frequency attenuation circuit is a notch filter.

5. A micro-electro-mechanical-system microphone package, comprising: a substrate;
   the micro-electro-mechanical-system microphone chip as claimed in claim 1, mounted on the substrate; and
   a cover attached to the substrate to cover the micro-electro-mechanical-system microphone chip, wherein the cover is provided with a sound inlet through which the micro-electro-mechanical-system microphone receives external sound.

6. The micro-electro-mechanical-system microphone package as claimed in claim 5, wherein the cover is attached to the substrate by glue.

7. The micro-electro-mechanical-system microphone package as claimed in claim 5, wherein the cover is not electrically conductive.

8. The micro-electro-mechanical-system microphone package as claimed in claim 7, wherein the cover is made of copper clad laminate, ceramic, or plastic.

9. The micro-electro-mechanical-system microphone package as claimed in claim 5, wherein the substrate is not electrically conductive.

10. The micro-electro-mechanical-system microphone package as claimed in claim 9, wherein the substrate is made of copper clad laminate, ceramic, or plastic.

11. A micro-electro-mechanical-system microphone package, comprising:

a substrate;

the micro-electro-mechanical-system microphone chip as claimed in claim 10, mounted on the substrate; and a cover attached to the substrate to cover the micro-electro-mechanical-system microphone chip, wherein the cover is provided with a sound inlet through which the micro-electro-mechanical-system microphone receives external sound.

12. The micro-electro-mechanical-system microphone package as claimed in claim 11, wherein the cover is attached to the substrate by glue.

13. The micro-electro-mechanical-system microphone package as claimed in claim 11, wherein the substrate is not electrically conductive.

14. The micro-electro-mechanical-system microphone package as claimed in claim 13, wherein the substrate is made of copper clad laminate, ceramic, or plastic.

15. The micro-electro-mechanical-system microphone package as claimed in claim 11, wherein the cover is not electrically conductive.

16. The micro-electro-mechanical-system microphone package as claimed in claim 15, wherein the cover is made of copper clad laminate, ceramic, or plastic.

* * * * *